(12) United States Patent
Gorczyca et al.

(10) Patent No.: US 6,504,233 B1
(45) Date of Patent: Jan. 7, 2003

(54) SEMICONDUCTOR PROCESSING COMPONENT

(75) Inventors: Thomas Bert Gorczyca, Schenectady, NY (US); Margaret Ellen Lazzeri, Schenectady, NY (US); Frederic Francis Ahlgren, Highland Heights, OH (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/340,794

(22) Filed: Jun. 28, 1999

(51) Int. Cl.⁷ .................................................. H01L 23/58
(52) U.S. Cl. ...................... 257/629; 257/632; 257/647; 428/426; 428/428; 428/446; 428/542.8; 118/70
(58) Field of Search ................................. 257/629, 632, 257/647; 428/426, 428, 446, 542.8; 118/70

(56) References Cited

U.S. PATENT DOCUMENTS

| | | | |
|---|---|---|---|
| 3,805,453 A | | 4/1974 | Schmall |
| 3,951,587 A | | 4/1976 | Alliegro et al. |
| 4,576,698 A | | 3/1986 | Gallagher et al. |
| 4,654,269 A | * | 3/1987 | Lehrer ........................ 428/428 |
| 4,761,134 A | | 8/1988 | Foster |
| 4,998,879 A | | 3/1991 | Foster et al. |
| 5,202,008 A | | 4/1993 | Talieh et al. |
| 5,401,319 A | | 3/1995 | Banholzer et al. |
| 5,565,058 A | | 10/1996 | Banholzer et al. |
| 5,762,748 A | | 6/1998 | Banholzer et al. |
| 5,851,307 A | | 12/1998 | Gilber et al. |
| 5,851,603 A | * | 12/1998 | Tsai et al. .................... 427/579 |
| 6,017,614 A | * | 1/2000 | Tsai et al. .................... 428/209 |

FOREIGN PATENT DOCUMENTS

| | | | |
|---|---|---|---|
| JP | 54-20023 | * | 2/1979 |
| WO | 00-32529 | * | 6/2000 |

* cited by examiner

*Primary Examiner*—David L. Talbott
*Assistant Examiner*—David A. Zarneke
(74) *Attorney, Agent, or Firm*—Noreen C. Johnson; Christian G. Cabou

(57) ABSTRACT

A semiconductor processing component includes a quartz body characterized by silicon oxide filled micro cracks. The component is utilized as a processing component in a semiconductor furnace system. The quartz body is prepared by cleaning the component to remove a build up silicon layer and to expose micro cracks in the surface of the component and to etch the micro cracks into trenches. A silicon layer is applied onto the processing component body and at least a portion of the silicon is oxidized to silica to fill the trenches in the surface of the component body.

20 Claims, 2 Drawing Sheets

SEMICONDUCTOR PROCESSING COMPONENT

BACKGROUND OF THE INVENTION

The present invention relates to a semiconductor processing component and to a furnace for the production of semiconductors. In particular, the invention relates to treating processing components that are used to process semiconductors in low pressure chemical vapor deposition chambers.

Low pressure chemical vapor deposition (LPCVD) is a film forming process for the production of semiconductor devices. The process is used in the formation of layers such as silicon nitride, silicon dioxide and polysilicon on a silicon wafer substrate. Low pressure techniques, that is, in the range of 0.5–3 torr have advantages in terms of uniformity in processing. Typically in the process, a substrate is placed in a reaction chamber, which is heated and brought to a low pressure state. A reaction gas is introduced into the chamber and reaction material is deposited on the substrate either by reaction or by thermal decomposition of the reaction gas.

The deposition is conducted at temperatures between 550° C. and 950° C., at a pressure of about 1 torr using processing components that. include:a liner, process tube, shield, baffle, paddle, cantilever arm, carrier or boat made out of fused quartz. Since the processing components are at the same temperature as the wafer substrate, the components are coated at every run with a layer as thick as the layer deposited on the substrate. After many runs, each component is covered with a thick film build-up. The film build-up causes a stress from the coefficient of thermal expansion (CTE) difference between silicon (2.9 ppm/° C.) or silicon nitride (5.0 ppm/° C.) and quartz (0.5 ppm/° C.). Eventually, this stress induces cracking in the surface of the quartz. The surface cracks weaken the component and generate particles that decrease process yield. Components such as wafer carriers or boats and related cantilever arms are more prone to crack formation because they are cycled from the process chamber temperature to room temperature with each run to allow loading and unloading of wafers.

There is a need to reduce the adverse effects of micro cracks in the surface of processing components.

SUMMARY OF THE INVENTION

The invention relates to a semiconductor processing component comprising a quartz body characterized by silicon oxide filled micro cracks and to a semiconductor furnace system, comprising the quartz body. The processing component is treated by applying a silicon layer onto the component body and oxidizing at least a portion of the silicon to silica to fill the micro cracks in the surface of the component body.

In another aspect, the invention is a heat treatment process, comprising preparing a quartz processing component by cleaning the component to remove a build up silicon layer and to expose micro cracks in the surface of the component and to etch the micro cracks into trenches. A silicon layer is applied onto the processing component body and at least a portion of the silicon is oxidized to silica to fill the trenches in the surface of the component body. The processing component is then installed within a processing chamber of a chemical vapor deposition furnace. A substrate to be treated is loaded into the processing chamber and a treatment gas is supplied into the processing chamber to form a film on the substrate surface.

DETAILED DESCRIPTION OF THE INVENTION

Figure 1:
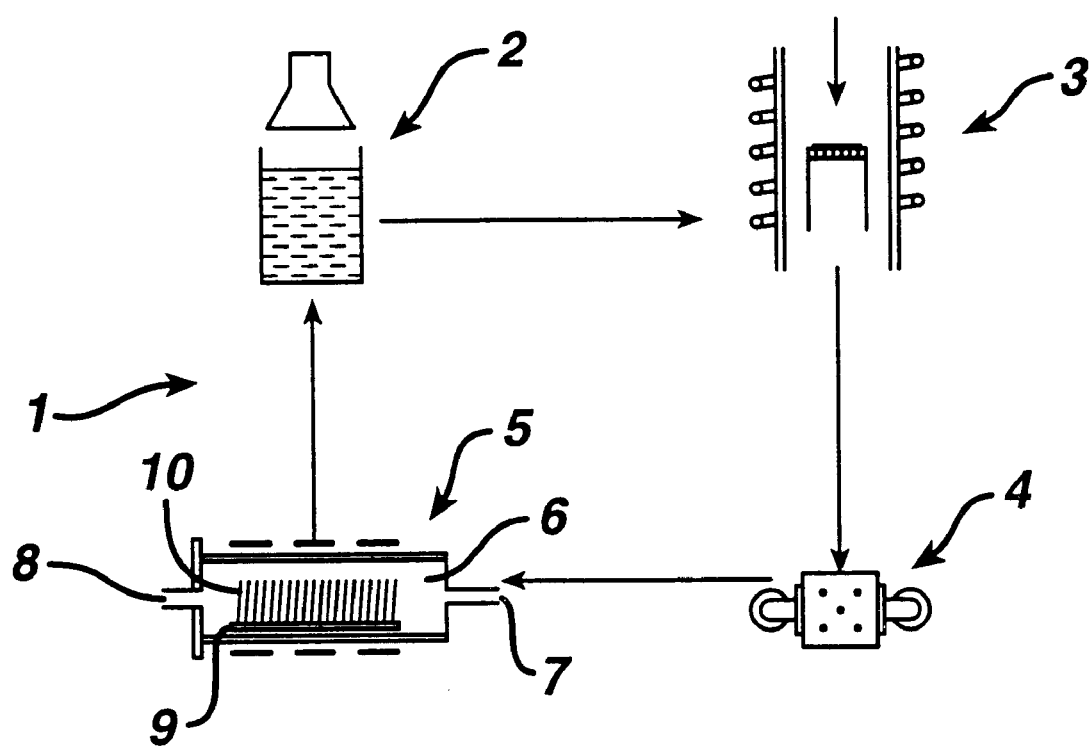
FIG. 1 is a schematic representation of a processing system and method for producing semiconductor wafers.

A layer such as a silicon coating is applied to a semiconductor wafer in a low pressure chemical vapor deposition process in which the wafer is held and/or transported into the process a furnace by means of quartz processing components such as wafer carriers or boats and related cantilever arms. The furnace includes other quartz processing components such as liners, process tubes, shields, baffles and paddles. The layer applied to the wafer also coats the quartz processing component surfaces. As a deposited silicon layer increases in thickness, stress is induced into the quartz surface of the component. The stress can exceed the component's fracture strength, resulting in spalling of the quartz, leaving it pitted and potentially unusable. The layer can cause cracking of the surface when the silicon deposit exceeds 2 microns in thickness.

It is the usual practice to remove a silicon layer from a quartz processing component before spalling occurs. However, removal of the silicon layer leaves micro cracks in the processing component surface. Application of additional thick silicon layers over the cracked quartz during subsequent chemical deposition processing will extend the cracks, eventually resulting in brittleness and failure.

Heretofore, it has been difficult to fill the micro cracks or otherwise treat the components to prevent extension of the cracks during subsequent chemical deposition processing. The cracks are characterized by a very high aspect ratio (depth/width >10). On account of the high aspect ratio, filling material seals off the crack entranceway before the crack is completely filled. The invention advantageously provides a method to completely fill and seal cracks on the surface of a quartz processing component body after removal of a contaminating layer deposited during chemical vapor deposition.

According to an exemplary embodiment of the invention, application of a thin silicon layer into the quartz cracks after the thick silicon layer has been removed fills and seals the cracks. A silicon layer deposited by LPCVD is very conformal, i.e. the layer is of a uniform thickness across the surface of the quartz and partly fills the quartz micro cracks. The quartz piece can then be inserted into an oxidizing environment to convert the deposited silicon into silicon dioxide, doubling the original deposited film thickness to fill the micro cracks. The oxidation step is self-limiting since once the crack fills, oxygen is prevented from reaching unreacted silicon. The high temperature of the oxidation step also helps to anneal out stress in the quartz surface. Additionally, the coefficient of thermal expansion (CTE) of the resulting silicon dioxide closely matches that of the quartz substrate. The CTE match further contributes to the reduction of stress during use of the component in LPCVD.

The invention provides a method of repairing and prolonging the useful life of a semiconductor quartz processing component by filling and sealing fine cracks in the quartz surface caused by the thick silicon deposit layer. The method can be accomplished in a semiconductor facility using standard thermal processing equipment.

These and other features will become apparent from the following drawings and detailed discussion, which by way of example without limitation describe embodiments of the present invention.

FIG. 1 of the drawings is a schematic representation of a processing system and method of treating a quartz processing component after use with or in a LPCVD furnace for applying a film to produce a semiconductor wafer. FIG. 1 shows system 1, which includes a cleaning apparatus represented by an etching apparatus 2, chemical vapor deposition apparatus 3 oxidizing apparatus 4 and LPCVD deposition furnace 5. The etching apparatus 2, chemical vapor deposition apparatus 3 oxidizing apparatus 4 and LPCVD deposition furnace 5 are represented by icons. The icons represent any apparatus that can be included in the system of the invention to carry out the function indicated. The icons are intended to broadly represent the invention and are not intended to represent specific apparatus or processing steps.

The LPCVD deposition furnace 5 includes a processing chamber 6 to maintain a reduced pressure having at least one gas inlet 7 to provide a reactive gas mixture therein and at least one exhaust outlet 8. A support 9 represents a quartz processing component such as a boat. The support 9 is positioned within the chamber 6 and an article 10 to be treated is shown positioned on the support 9.

In accordance with an exemplary embodiment of the invention, the support 9 is withdrawn from furnace 5 and treated by chemical etch in the etching apparatus 2 or the like. A silicon layer is applied in the CVD Apparatus 3 to partially fill micro cracks in the surface of the support and the film is subjected to an oxidizing ambient in the oxidizing apparatus 4 to produce silicon oxide which fills the micro cracks and provides and conformal layer of silicon oxide to the support. The support 9 is then used to convey wafers 10 into and out of LPCVD deposition furnace 5 for processing.

In the first cleaning step at cleaning apparatus 2, a component with build-up film is cleaned using standard wet etching techniques or other cleaning techniques. The cleaning step can comprise immersing the component in a solution comprising hydrofluoric acid and nitric acid with optional acetic acid or water components. Proportions of hydrofluoric acid and nitric acid in the solution can vary from 1 to 70 vol % and the acetic acid and water can vary from 1 to 50 vol %. A desirable solution comprises 20 to 60 vol % hydrofluoric acid, 20 to 60 vol % nitric acid, and 1 to 30 vol % for acetic acid and water. A preferred etching solution comprises 30 to 50 vol % for each of hydrofluoric acid and nitric acid, and 10 to 30 vol % for acetic acid and water. A component can be contacted with a preferred etching solution for a period between about 0.1 minutes to about 2 hours, desirably between about 0.5 to 30 minutes and preferably between about 1 to about 5 minutes. The temperature of the etching solution can be between about 10° C. to about 40° C. with a preferred temperature between about 20° C. to about 25° C.

Other forms of etching such as gas or vapor phase etching can be used to conduct the cleaning step according to other embodiments of the invention. The gas or vapor phase etching can use gasses such as ammonium fluoride or sulfur hexafluoride at elevated temperatures. Plasma etching using fluorine containing gases and optionally a coreactant in a plasma discharge system can be used to conduct the cleaning step. Suitable fluorine containing gasses for plasma etching include ammonium fluoride, sulfur hexafluoride, tetrafluoromethane hexafluoroethane, dichlorodifluoromethane and gasses generally classified as freons. The plasma etching gas can also include oxygen, nitrous oxide, hydrogen, boron trichloride, fluorine and combinations thereof.

Figure 2:
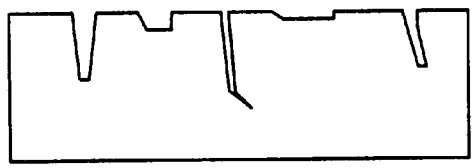
FIG. 2 is a schematic representation of a quartz surface after silicon deposit and etch-back.

In one method for cleaning the silicon film, the quartz component is immersed in an etchant solution containing 35% by volume of 50% hydrofluoric acid, 35% by volume of 70% nitric acid and 30% by volume water. Once the silicon film is removed, the etchant solution will slowly etch the quartz component. The quartz component surface is characterized by cracks that have resulted from stress during the LPCVD coating step. The etchant enters the cracks and isotropically etches in all directions, to widen the cracks and to round out their tips to terminate further crack encroachment into the quartz and to reduce surface stress during subsequent use. FIG. 2 is a schematic representation of a quartz surface after etching.

The component is etched for a period required to remove the silicon plus a period required to etch the quartz to convert the micro cracks into trenches. This period varies with etch rate and immersion time. The period to remove the silicon coating is determined by observing surface changes in the quartz component during cleaning. As the coating is removed, the component surface transforms from opaque to clear and transparent. The component is then etched an additional period between about 1 to about 5 minutes. The amount of quartz etched during the additional period can be determined by measuring the quartz thickness before and during etching. The trench width of the quartz component is opened at a rate identical to the change in total thickness.

The width of the trench after chemical etching is typically twice as wide as the thickness of quartz removed from the surface of the component during the removal of the coating film. Etched trench widths can vary from less than 1 micron to 50 microns wide. Preferably, the etched trench width is between about 1 to about 5 microns. The thickness of silicon deposited onto the quartz component and into the trench can range from about 1% to about 75% of the trench width. Preferably, the thickness is from about 20% to 30% of the trench width.

Figure 3:
FIG. 3 is a schematic representation of a quartz surface after deposit of ~1 micron silicon.
Figure 4:
FIG. 4 is a schematic representation of the quartz surface of FIG. 3 after oxidation of the silicon deposit.

For example, the $HF/HNO_3/H_2O$ etchant solution etches a 10 micron silicon coating from a quartz component in about 1 minute. Etching for an additional minute will etch the micro cracks to form trenches about 2 microns wide. A conformal layer of silicon is then deposited by chemical vapor deposition apparatus 3 and oxidized by the oxidizing apparatus 4 to fill the cracks. FIG. 3 is a schematic representation of a quartz surface after deposit of about 1 micron of silicon. FIG. 4 shows the quartz surface of FIG. 3 after oxidation of the silicon deposit. This film can be deposited using silane gas in a deposition chamber set at 550° C. to 700° C. and at 100 to 2000 mTorr pressure. Other gasses and processes can be used to deposit the silicon layer, such as dichlorosilane or silicon tetrachloride and hydrogen, processed at temperatures from 700° C. to 1000° C. and pressures from 100 mTorr to atmospheric pressure. Preferred deposition conditions for depositing silicon use silane gas at a temperature in a range between 500° C. to 600° C., at a pressure between about 0.5 to 1 torr.

In one method, CVD depositional equipment is used to deposit approximately 0.5 microns of conformal CVD silicon onto a quartz component having trenches approximately 2 microns wide. This thickness of coating fills about ½ the volume of the trenches. A preferred coating thickness for silicon fills approximately ½ the volume of the trench, or a coating thickness of ¼ the trench width. Actual coating thickness ranges from about 10% to about 50% of the trench width. Preferably, the coating thickness is from about 20% to about 30% of the trench width.

The coated quartz component is then subjected to an oxidizing ambient within a suitable furnace. The furnace ambient can comprise from 1% of oxygen in an inert gas such as nitrogen or argon to 100% oxygen or the ambient can comprise from 1% steam with an inert gas such as nitrogen or argon or with another oxidizing gas such as oxygen to 100% steam. The oxidation rate of silicon in steam is approximately 5 times the rate of that measured in dry oxygen. Hence, a preferred oxidizing ambient comprises 90% to 100% steam with oxygen. The furnace temperature for oxidation can be within the range of 200° C. to 1200° C., preferably between 900° C. and 1100° C.

The time required to oxidize silicon into silica increases approximately exponentially with the silicon thickness, that is, doubling the silicon thickness will require about 4 times the amount of time to completely oxidize the silicon. If a 0.25 micron thick silicon layer is oxidized in a steam ambient at 1000° C. in about 1.5 hours, a 0.5 thick layer is oxidized in steam at 1000° C. in about 6 hours.

For example, a component etched to 2 micron wide trenches and coated with 0.5 microns of silicon can be heated at 1000° C. in an oxidizing stream ambient for 6 hours to completely oxidize the silicon to silica. The coating can be observed to change from opaque to transparent as the silicon is oxidized to silica. Hence, the oxidation step can be controlled by observing the change in coating appearance and adjusting conditions accordingly. The trenches are completely filled as the coated material expands in volume as it is oxidized. The oxidation can be limited as sufficient silicon is oxidized to fill the trenches. For example, the process of the invention can comprise a plurality of sequential steps of silicon deposition and oxidation. The sequential process permits control of the process so that no further oxidation occurs once the trenches are filled.

In another aspect of the invention, a doped silicon layer is applied to the quartz processing component. In this embodiment, the silicon layer can be applied from a silicon source such as dichlorosilane or silicon tetrachloride with a phosphorus or boron source such as phosphine, diborane or boron trichloride. The layer can be applied as a silane doped with 1wt % to 10 wt % phosphine or boron trichloride, preferably doped with 2wt % to 5 wt % phosphine or boron trichloride. The deposition conditions are the same as those for depositing undoped silicon. The dopants allow oxidation of the silicon into silica at lower temperatures and cause the resulting doped silica to reflow during the oxidation step to provide improved filled cracks and a more smooth quartz surface texture.

In still another aspect, a material such as silicon dioxide, silicon nitride or silicon carbide is applied to fill and seal the micro cracks on the quartz surface. These materials can provide conformal coatings however they do not undergo volume expansion during an oxidation process. In this embodiment, the processing component is coated with a material that seals the micro cracks on the quartz surface. Suitable materials are film forming materials such as silicon dioxide, silicon nitride or silicon carbide.

A silicon dioxide coating can be formed by applying a silicon source such as a silane, dichlorosilane or silicon tetrachloride in combination with a coreactant such as oxygen, nitrous oxide or nitric oxide. A silicon nitride coating can be formed by applying the silicon source with a coreactant such as ammonium or nitrogen. A silicon carbide coating can be formed by applying the silicon source with a gaseous organic carbon coreactant such as methane, ethane, butane or ethylene. Also, a silicon carbide coating can be formed from a silicon containing organic material such as tetramethylsilane, tetraethylsilane or tetrabutylsilane. Combination coatings can be formed by introducing a silicon source into a CVD processing chamber with combinations of the coreactants. For example, dichlorosilane can be coreacted with nitrous oxide and ammonia to provide a silicon oxynitride coating or dichlorosilane could be introduced along with methane and ammonia to form a silicon nitride-carbide coating.

The coatings can be deposited by introducing the appropriate gasses for the selected film into a CVD processing chamber at a deposition temperature between about 400° C. to 1100° C. and at a pressure between about 100 mTorr to atmospheric pressure. In a preferred deposition process, a silicon dioxide coating is deposited from dichlorosilane and nitrous oxide gas at a temperature between about 850° C. and 950° C. and at a pressure between about 0.5 and 1 torr. A silicon nitride coating is preferably deposited from dichlorosilane and ammonia gas at a temperature between about 750° C. and 900° C. and at a pressure of 0.5 to 1 torr. A silicon carbide coating is preferably deposited from dichlorosilane and methane gas at a temperature between about 850° C. and 950° C. and at a pressure of 0.5 to 1 torr. The silicon dioxide, silicon nitride or silicon carbide coating can be between from about 50% to about 100% of the trench width to completely fill the trench. Preferably, the coating is between about 50% to 60% of the trench width.

In yet another aspect the quartz component may be coated with a film by dip or spray coating using an oregano silicate or siloxane polymer solution. These materials are commonly referred to as "spin on glass." The materials can be used to fill very narrow, high aspect spaces on silicon wafers during semiconductor manufacturing. In this embodiment of the invention, these materials are used as a treatment to seal cracks that are left after removing silicon film from a quartz processing component. Typical materials used include siloxane polymers, methylsiloxane polymers, methylsilsesquioxane (available from Allied Signal Co,), benzocyclobutene (BCB or Cyclotene, available from Dow Chemical) and similar materials. Following coating, the film is heated to a temperature between about 200° C. to 500° C. for about 1 to 5 hours in an oxidizing or inert ambient to remove solvent or moisture to cure the coating. Preferably, the coated component is heated in an oxygen or nitrogen ambient at a temperature between about 250° C. to 350° C. for between about 1 to 4 hours.

EXAMPLE

An initially smooth, fire polished quartz test piece was exposed to 10 low pressure CVD depositions of 1 micron of amorphous silicon deposited at 560° C. After the deposits were completed, the silicon was etched off the quartz using a solution of 35% HF (49%), 35% $HNO_3$(70%) and 30% $H_2O$. Etch time was extended slightly (~1 minute) beyond the time required to remove silicon (also ~1 minute) to allow the HF to open the surface cracks slightly. An additional layer of amorphous silicon, 0.5 micron thick, was then deposited onto the quartz sample at 560° C. using silane gas in a CVD deposition chamber. The sample was then oxidized in a steam ambient at 1000° C. for 6 hours to oxidize the deposited silicon layer. During oxidation, the layer expanded by about 2× of its initial thickness to fill the remaining volume of the half filled micro cracks.

While embodiments of the invention have been described, the present invention is capable of variation and modification and therefore should not be limited to the precise details of the examples. The invention includes changes and alterations that fall within the purview of the following claims.

What is claimed:

1. A semiconductor processing component comprising a quartz body which includes silicon oxide filled micro cracks.

2. The component of claim 1, comprising a liner, process tube, shield, baffle, paddle, cantilever arm, carrier or boat.

3. The component of claim 1, wherein said silicon oxide includes a dopant.

4. The component of claim 3, wherein said dopant is selected from the group consisting of boron, phosphorus and a combination of boron and phosphorus.

5. The component of claim 1, comprising a cantilever arm, carrier or boat that is cycled into and out of a LPCVD furnace during processing of a semiconductor wafer.

6. The semiconductor processing component of claim 1, wherein the micro cracks have rounded ends substantially in the form of trenches.

7. The semiconductor processing component of claim 1, wherein the micro cracks have rounded ends substantially in the form of trenches between about 1 to 50 microns in width.

8. The semiconductor processing component of claim 1, wherein the micro cracks have rounded ends substantially in the form of trenches between about 1 to 5 microns in width.

9. The semiconductor processing component of claim 1, wherein the micro cracks have an aspect ratio >10 (depth/width).

10. A semiconductor processing component comprising a quartz body having micro cracks substantially filled with silicon dioxide, silicon nitride or silicon carbide and sealed with a film-forming material.

11. The semiconductor processing component of claim 10, wherein the film-forming material is silicon dioxide, silicon nitride or silicon carbide.

12. The semiconductor processing component of claim 10, wherein the film-forming material is a combination coating.

13. The semiconductor processing component of claim 10, wherein the film-forming material is a combination coating comprising silicon oxynitride or a silicon carbide.

14. The semiconductor processing component of claim 10, wherein the micro cracks have rounded ends substantially in the form of trenches.

15. The semiconductor processing component of claim 10, wherein the micro cracks have rounded ends substantially in the form of trenches between about 1 to 50 microns in width.

16. The semiconductor processing component of claim 10, wherein the micro cracks have rounded ends substantially in the form of trenches between about 1 to 5 microns in width.

17. The semiconductor processing component of claim 10, wherein the micro cracks have an aspect ratio >10 (depth/width).

18. A quartz body processing component comprising:
   trenches formed out of micro cracks on a surface of said component, said component surface being free from a buildup of silicon;
   a silicon layer on said component to partially fill said trenches;
   a silica layer formed by oxidation of at least a portion of said silicon layer to further fill said trenches.

19. A semiconductor processing component comprising a quartz body which includes silicon dioxide or silicon nitride capped micro cracks.

20. A semiconductor processing component comprising a quartz body which includes micro cracks sealed with a conformal layer of silicon dioxide, silicon nitride, silicon carbide or spin on glass.

* * * * *